United States Patent [19]

Gracia et al.

[11] Patent Number: 5,254,429
[45] Date of Patent: Oct. 19, 1993

[54] PHOTOPOLYMERIZABLE COATING COMPOSITION AND LITHOGRAPHIC PRINTING PLATE PRODUCED THEREFROM

[75] Inventors: Robert F. Gracia, Woodstock; Shek C. Hong, Vernon; William J. Ryan, Middletown, all of Conn.

[73] Assignee: Anocoil, Rockville, Conn.

[21] Appl. No.: 627,710

[22] Filed: Dec. 14, 1990

[51] Int. Cl.$^5$ .............................................. C03C 1/54
[52] U.S. Cl. .................................... 430/162; 430/176; 430/196; 430/197; 430/273; 430/298; 430/284; 522/88; 522/89
[58] Field of Search ............... 522/88, 89; 430/284, 430/159, 162, 176, 196, 197, 278, 273

[56] References Cited

U.S. PATENT DOCUMENTS

| | | | |
|---|---|---|---|
| 3,136,637 | 6/1964 | Larson | 96/75 |
| 3,458,311 | 7/1969 | Alles . | |
| 3,462,267 | 8/1969 | Giangualano et al. | 96/33 |
| 3,808,004 | 4/1974 | Thomas et al. | 96/68 |
| 3,905,815 | 9/1975 | Bonham | 96/68 |
| 4,228,232 | 10/1980 | Rousseau | 430/278 X |
| 4,233,390 | 11/1980 | Jargiello | 430/156 |
| 4,304,923 | 12/1981 | Rousseau | 560/26 |
| 4,417,025 | 11/1983 | Toba et al. | 525/54.21 |
| 4,511,646 | 4/1985 | Fohrenkamm et al. | 522/89 X |
| 4,565,857 | 1/1986 | Grant | 527/301 |
| 4,656,202 | 4/1987 | Nason et al. | 522/89 |
| 4,839,230 | 6/1989 | Cook | 428/423.1 |
| 4,839,254 | 6/1989 | Pawlowski et al. | 430/175 |
| 4,840,868 | 6/1989 | Pawlowski et al. | 430/176 |
| 4,855,184 | 8/1989 | Klun et al. | 522/88 X |
| 4,859,562 | 8/1989 | Pawlowski et al. | 430/175 |
| 4,861,629 | 8/1989 | Nahm | 522/89 X |
| 4,886,731 | 12/1989 | Sypek et al. | 430/156 |

OTHER PUBLICATIONS

UV-Curable Cellulose Esters—Phillip M. Cook-Eastman Chemical Company.

Primary Examiner—Marion E. McCamish
Assistant Examiner—Janis L. Dote
Attorney, Agent, or Firm—Felfe & Lynch

[57] ABSTRACT

The present invention provides photopolymerizable coating compositions comprising (a) a photosensitive compound selected from the group consisting of photoinitiators and negative-working photosensitive substances which are present in an amount effective to render the compositions sensitive to radiant energy, and (b) an ethylenically unsaturated, urethane-containing, self-crosslinkable grafted cellulose ester polymer; imaging elements for use in offset printing processes prepared therefrom; and processes employing said imaging elements.

18 Claims, No Drawings

PHOTOPOLYMERIZABLE COATING COMPOSITION AND LITHOGRAPHIC PRINTING PLATE PRODUCED THEREFROM

FIELD OF THE INVENTION

The present invention relates to photopolymerizable compositions that are based on an ethylenically unsaturated, self-crosslinkable, urethane-containing grafted cellulose ester polymer. The photopolymerizable compositions of the present invention are especially suitable for producing lithographic printing plates used in offset printing applications.

BACKGROUND OF THE INVENTION

Diazonium and photopolymerizable compositions have been used in photosensitive elements, such as lithographic offset printing plates, for a number of years. In the field of lithographic offset printing, there are known many processes for producing an image on a substrate by exposure to U.V. radiation via use of such photopolymerizable compositions and thereafter developing the image. One of the earlier methods is the additive process whereby the image is reinforced with an additive lacquer. Although useful for many years, the image produced by such a process currently has limited application as it does not have desirable wear and chemical resistance properties; the quality of the image is oftentimes only fair; and the developer needed to produce such an image employs solvents which are toxic and hazardous to the environment.

A presensitized lithographic printing plate is described in U.S. Pat. No. 3,136,637, which employs an organophilic, hydrophobic resin overlaying a light sensitive diazo layer which upon exposure becomes insolubilized, and which in turn is coated on a dimensionally stable hydrophilic surface base sheet which is typically metal. This process is inherently undesirable in that the exposed image, although hardened and adherent to the underlying diazo base layer, is prone to attack and partial removal during development. The overlying resin image is also prone to attack by pressroom solvents such as blanket washes and common cleaners for printing plates.

A presensitized printing plate having a dual layer coating of an intermediate sensitized diazo layer on a base plate on top of which is a photopolymerizable prepolymer resist composition is described in U.S. Pat. No. 3,462,267. The prepolymer is an aryl alkyl ester which requires relatively long exposure times, and must be developed by toxic and hazardous solvents such as xylene, methylethylketone and trichloroethane.

U.S. Pat. No. 3,808,004 describes a lithographic plate employing a photopolymerizable coating over a diazo base resin. Conventional polymerizable resins such as polyvinyl cinnamate available from Eastman Kodak are employed and exposed plates are developed with commercial additive lacquers. These plates suffer, however, from poor shelf life and toxic and hazardous solvents used in their development.

U.S. Pat. No. 3,905,815 discloses a lithographic printing plate comprising a hydrophilic base-sheet which bears a coating of a light-sensitive diazo resin, over which is coated a nontacky, soluble, photopolymerizable layer. The photopolymerizable layer comprises a film forming binder having dispersed therethrough one or more polymerizable monomers and a photoinitiator system. These compositions are, however, susceptible to overdevelopment, as the film forming binders are not polymerizable.

U.S. Pat. No. 4,233,390 describes a lithographic printing plate comprised of two layers; one water soluble diazo-based layer having coated thereon a second photopolymerizable layer comprised of a photopolymerizable monomer or oligomer, a photoinitiator, and various non-polymerizable resins. In addition to using toxic photoinitiators, for example, Michler's Ketone, and requiring additional and expensive non-polymerizable resins, this composition also requires undesirably high coating weights.

A photopolymerizable printing plate employing a polymerizable composition comprising a specific solvent-soluble diazo composition on a hydrophilic surfaced substrate is described in U.S. Pat. No. 4,886,731. The polymerizable coating is made up of three layers: a first layer comprising a water-soluble diazo compound; a second layer containing a solvent-soluble diazo compound and a trifunctinal acrylate monomer; and a top coat layer containing photoinitiators, functional acrylate oligomer, the trifunctional acrylate monomer, a polymer binder containing a pigment, and the solvent-soluble diazo compound employed in the second layer. The application of the separate coatings on one another in the necessary amounts renders such a system commercially undesirable.

It is therefore an object of the present invention to provide a photopolymerizable coating composition useful in producing lithographic offset printing plates which avoids the shortcomings and disadvantages of conventional printing systems.

It is also an object of this invention to provide a method for the production of such a lithographic offset printing plate and method for its use.

SUMMARY OF THE INVENTION

In accomplishing the foregoing objects, there is provided a novel and improved photopolymerizable coating composition based on an ethylenically unsaturated, urethane-containing, self-crosslinkable grafted cellulose ester polymer for use with a substrate suitable for offset printing which avoids the shortcomings and disadvantages of conventional printing systems. In its broadest sense, the present invention provides a photopolymerizable coating composition comprising (a) a photosensitive compound selected from the group consisting of photoinitiators and negative-working photosensitive substances, and which is present in an amount effective to render said composition sensitive to radiant energy, and (b) an ethylenically unsaturated, urethane-containing, self-crosslinkable grafted cellulose ester polymer of the formula,

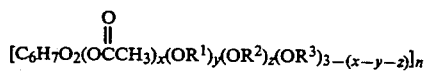

wherein

R$^1$ is a (meth)acrylate moiety of the formula

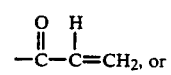

-continued

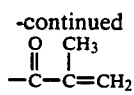

$R^2$ is a α-methylstyrene moiety of the formula

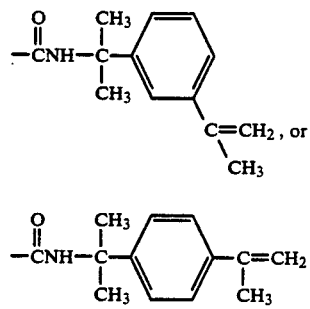

$R^3$ is independently H,

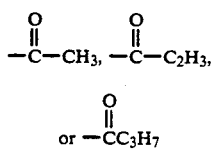

x is 0.1 to 2.5
y is 0.1 to 2.0
z is 0.1 to 2.0 and
n is 30–250, provided that (x+y+z) is in the range of 0.3 to 3.0.

A storage stable photosensitive imaging element, for example a developable offset printing plate, can be made by applying the photopolymerizable coating composition of the present invention in one or more layers to a support layer or substrate suitable for offset printing.

Preferred embodiments of the present invention are directed to the photopolymerizable coating composition comprising a particular photosensitive compound and/or a particular support, for example a particular lithographic substrate, and additionally said composition comprising one or more additives such as dyes, pigments, coating aids, surfactants, stabilizers, polymerizable monomers and oligomers, binders, and the like and further optionally employing a top coat.

In a preferred embodiment of the present invention, there is provided a photopolymerizable coating composition for use with a substrate suitable for offset printing, and wherein the photopolymerizable coating composition comprises a diazonium salt condensation product of a condensable aromatic diazonium compound with an aldehyde, a dye and the aforesaid grafted cellulose ester polymer.

In another preferred embodiment there is provided a photopolymerizable coating composition for use with a substrate suitable for offset printing, preferably an anodized, silicated substrate such as described in U.S. Pat. No. 3,161,481, wherein the photopolymerizable coating composition comprises the aforesaid grafted cellulose ester polymer, one or more multifunctional monomers or oligomers, one or more photoinitiators, and one or more stabilizers.

Further preferred is the aforesaid coating composition applied as a single base coating to a substrate suitable for use in offset printing, and further comprising a top coat layer comprising polymeric binder which is preferably substantially impermeable to oxygen.

In a further preferred embodiment of the present invention there is provided a photopolymerizable coating composition for use with a substrate suitable for offset printing, said photopolymerizable coating composition comprising the aforesaid grafted cellulose ester polymer, a diazonium compound, one or more photoinitiators, one or more multifunctional monomers or oligomers, and a dye and/or a pigment.

The present invention is also directed to processes for preparing imaging elements comprising the aforesaid compositions, and processes for the use thereof in offset printing applications. The compositions of the invention are also useful in resist applications for printed circuits, color-proofing systems and duplicating systems.

DETAILED DISCUSSION OF THE INVENTION

The photopolymerizable coating composition of the present invention for use with a substrate suitable for offset printing, and comprising a photosensitive compound such as a photoinitiator and/or a negative-working photosensitive substance, for example, a diazonium compound, is based on an ethylenically unsaturated urethane-containing, self-crosslinkable grafted cellulose ester polymer of the formula,

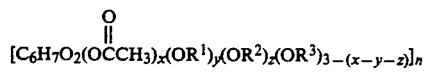

wherein
$R^1$ is a (meth)acrylate moiety of the formula

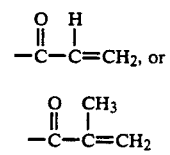

$R^2$ is a α-methylstyrene moiety of the formula

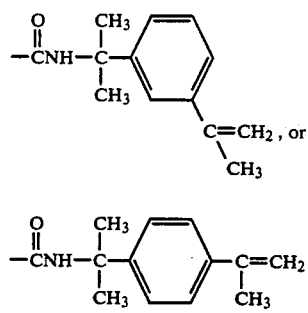

$R^3$ is independently H,

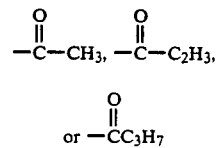

x is 0.1 to 2.5
y is 0.1 to 2.0 z is 0.1 to 2.0 and n is 30–250, provided that (x+y+z) is in the range of 0.3 to 3.0.

The grafted cellulose ester polymer of the present invention having pendant (meth)acrylic and 2-methylstyrene moieties is a urethane-containing resin which upon exposure to ultraviolet radiation in the presence of a photoinitiator and/or a negative-working photosensitive substance forms a crosslinked polymeric network. The crosslinking of these grafted cellulose esters upon exposure to radiant energy is not necessarily dependent upon the presence of vinyl monomers, but are "self-crosslinkable".

The grafted cellulose ester polymer can be prepared by reacting a cellulose ester containing residual hydroxyl groups with an acrylic based compound and m-isopropenyl-α,α'-dimethylbenzyl isocyanate. The grafted polymer and its preparation are further discussed in detail in U.S. Pat. No. 4,839,230, the entire disclosure of which is incorporated herein by reference. The cellulose ester polymer is available from Eastman Kodak Co under the designation curable cellulose product 11996.

Numerous substances can be suitably employed as photoinitiators in the photopolymerizable compositions of the present invention and include compounds which facilitate polymerization on addition of radiant energy. Such initiators include acyloin and derivatives thereof, such as benzoin, benzoin methyl ether, benzoin ethyl ether, benzoin isopropyl ether, benzoin isobutyl ether, and 2-hydroxy-2-methyl-1,2-diphenylethanone; diketones such as benzil and acetyl, benzil ketals, etc.; phenones such as acetophenone, 2,2,2-tribromo-1-phenyl ethanone, 2,2-diethoxyacetophenone, 2,2-dimethyloxy-2-phenylacetophenone, 2,2,2-tribromo-1-(2-nitrophenyl)ethanone, benzophenone, 4,4′bis(-dimethylamino)benzophenone, 1-hydroxycyclohexylphenyl ketone; organic peroxides and organic hydroperoxides, such as benzoyl peroxide, tertiary-butyl perbenzoate, cumene hydroperoxide, and the like, and mixtures of two or more of the foregoing such as, for example, acetophenone/and benzophenone/tertiary amine combinations. A preferred photoinitiator for use herein are the Irgacure® line of photoinitiators available from Ciba-Geigy, with Irgacure 907 (2-methyl-1-[4-(methylthio)phenyl]-2-morpholinopropanone-1) being particularly preferred.

The photopolymerizable coating compositions of this invention do not have to be formulated with the aforementioned photopolymerization initiators, but instead, depending upon a preferred embodiment, can comprise a negative-working photosensitive substance, such as, for example, diazo compounds and diazonium salt polycondensates. Virtually all known negatively-functioning photosensitive substances can be employed in the present invention provided they are compatible with the photopolymerizable coating compositions. Some examples of such substances include diazonium salt polycondensaton products, such as condensation products of condensable aromatic diazonium salts with aldehyde. Exemplary of such condensation products and especially preferred herein are the products of diphenyl-4-diazonium salts with formaldehyde, for example a diazonium salt obtained from the condensation of 3-methoxyparadiazodiphenylamine and formaldehyde. Other examples of suitable compounds include 4-diazodiphenylamine sulfate, 1-diazo-4-N,N-dimethylaminobenzene zinc chloride, 1-diazo-4-N,N-diethylaminobenzene zinc chloride 1-diazo-4-N-ethyl-N-hydroxyethylamino-benzene, zinc chloride 1-diazo-4-N-Methyl-N-hydroxyethylamino-benzene, zinc chloride 1-diazo-2,5-diethoxy-4-benzoylamino-benzene, zinc chloride 1-diazo-4-N-benzylamino-benzene, zinc chloride 1-diazo-4-N,N-dimethylamino-benzene borofluoride 1-diazo-4-morpholino-benzene, zinc chloride 1-diazo-4-morpholino-benzene-borofluoride 1-diazo-2,5-dimethoxy-4-p-tolylmercaptobenzene, zinc chloride 1-diazo-2-ethoxy-4-N,N-dimethylaminobenzene, zinc chloride p-diazo-dimethyl aniline, zinc chloride 1-diazo-4-N,N-diethylamino-benzene, zinc chloride 1-diazo-2,5-dibutoxy-4-morpholino-benzene sulfate 1-diazo-2,5-diethoxy-4-morpholino-benzene, zinc chloride 1-diazo-2,5-dimethoxy-4-morpholino-benzene, zinc chloride 1-diazo-2,5-diethoxy-4-morpholino-benzene, zinc chloride 1-diazo-2,5-diethoxy-4-morpholino-benzene-borofluoride 2-diazo-1-naphthol-5-sulfonic acid, sodium salt 1-diazo-4-N,N-diethylamino-benzene, borofluoride 1-diazo-2,5-diethoxy-4-p-tolymercapto-benzene, zinc chloride 1-diazo-3-ethoxy-4-N-methyl-N-benzylamino-benzene, zinc chloride 1-diazo-3-chloro-4-N,N-diethylamino-benzene, zinc chloride 1-diazo-3-methyl-4-pyrrolidino-benzene, zinc chloride 1-diazo-3-methyl-4-pyrrolidino-benzene-borofluoride 1-diazo-2-chloro-4-N,N-dimethylamino-5-methoxybenzene, borofluoride 1-diazo-3-methoxy-4-pyrrolidino benzene, zinc chloride, and the condensation product of 4-diazodiphenylamine sulfate and formamdehyde zinc chloride.

The photosensitive compounds are employed in the present invention in amounts effective to render the photopolymerizable composition sensitive to radiant energy and to facilitate the self-crosslinking of the grafted cellulose ester polymer.

Depending upon the embodiment preferred and the end uses contemplated, the negative-working photosensitive substances can be employed in combination with the aforesaid photoinitiators in formulation with the grafted cellulose ester polymer to prepare the photopolymerizable coating compositions of the present invention.

The photopolymerizable compositions can additionally comprise polymerizable monomers and oligomers including compounds having one or more ethylenically unsaturated groups, such as, for example, (meth)acrylates and esters of (meth)acrylic acid such as methyl methacrylate, ethyl acrylate, 2-ethylhexyl acrylate, chlorohexyl acrylate, stryene, 2-chlorostyrene, 2,4 -dichlorostyrene, acrylic acid, acrylamide, acrylonitrile, t-butyl acrylate, methyl acrylate, butyl acrylate, 2-(N-ethylcarbamyl)ethyl methacrylate, 1-4-butylene diacrylate or dimethacrylate, ethylene glycol diacrylate and dimethacrylate, hexanediol diacrylate or dimethylacrylate, glyceryl diacrylate or dimethylacrylate, glyceryl triacrylate or trimethylacrylate, diallyl phthalate, dipentaerythritol pentacrylate, 1,3,5-tri(2-methacryloyloxyethyl)-a triazine, diglycerol diacrylate, guaiacol glycerol ethylacrylate, neopentylglycol diacrylate, 2,2-dimethylol-butan-3-ol diacrylate, pentaerythritol tri- and tetraacrylate and the corresponding methacrylates, and trimethylol propanetriacrylate, and the like.

Such modifying monomers and oligomers are generally employed to enhance the properties of the coatings, for example, to improve hardness, flexibility and cohesion and the like depending upon specific end uses contemplated and may also be employed as a reactive diluent.

In addition to the polymerizable monomers described above, other modifying polymerizable ethylenically unsaturated coreactants can be used in the photopolymerizable compositions of the invention, such as, for example, acrylated epoxy, acrylated polyester, and acrylated urethane oligomers and resins. The compositions of the invention (besides the monomers, oligomers and resins mentioned above) can also include any number of additional useful additives such as, for example, stabilizers, binders, inhibitors, lubricants, flexibilizers, surfactants, wetting agents, pigment, dyes, and fillers such as finely divided silica, diatomaceous earth, metal oxides, fiberglass, talc, and flow control or thixotropic agents. The addition and amount of such materials, which are preferably transparent to radiation, will depend upon their well known properties, and on the particular end uses contemplated for the present inventive coating compositions.

It is also preferred in some embodiments to employ a radical polymerization inhibitor in the photopolymerization coating compositions of the invention to insure that the coatings do not cure prematurely Such compounds are generally useful in amounts ranging from about 0.001 to about 0.1 weight percent, but can extend well outside these ranges depending upon the particular embodiment of photopolymerization composition sought. Some examples of suitable inhibitors include hydroquinone, hydroquinone monomethyl ethyl, catecholo, 2,6-ditertiarybutyl-4-methyl-phenol, phenothiazine and the like. Such inhibitors are also described in U.S. Pat. No. 4,656,202.

The coating compositions of the invention can be processed in a conventional manner and are preferably prepared by simply mixing in desired proportions the above-described grafted cellulose ester polymer and a suitable photosensitive system, for example, a photoinitiator and/or a negative working photosensitive substance which is or are present in an amount effective to render the composition sensitive to radiant energy, in a suitable solvent or solvent mixture. Other additives, depending upon the preferred embodiments, can also be added to this mixture. Such additives, their properties and possibilities of use are known to those skilled in the art. Examples of some suitable solvents include ethylene glycol monomethyl ether, propylene glycolmonomethyl ether, ethylene glycol monoacetate, dioxane, tetrahydrofuran and butanone If reactive modifying monomers or oligomers are employed as a reactive diluent, solvents may not be required. The actual choice of solvent will usually depend on such factors as the particular embodiment of coating composition employed and the coating method contemplated.

The compositions thus obtained as described above can be filtered for the purpose of further processing in order to remove any undissolved constituents, and are applied to a support material or substrate suitable for use in lithographic offset printing. The coating composition of this invention can be applied to a support by conventional methods, for example, by knife coating, spinning, spraying, dipping, brushing and the like. After the coating is applied it is allowed to dry. If desired, added heat in the form of forced hot air may be employed to accelerate evaporation of the solvent. Additional intermediate coatings may be applied to increase coating thickness if desired, although a single coating of the present composition is generally sufficient for most applications.

Support materials that are suitable for coating in accordance with the present invention include conventional lithographic substrates suitable for offset printing, and include among others, magnesium, zinc, copper, aluminum which has been roughened up mechanically or electrochemically and which can be further anodized and post-treated, and optionally polyester film or cellulose acetate film, the surfaces of which have preferably been pretreated as is known in the art.

The support material may be a final support or a temporary support material from which the photosensitive layer is transferred by lamination to the workpiece to be processed and employed in offset printing.

In one embodiment of the present invention, it is particularly preferred to pretreat an aluminum substrate by a chemical, mechanical and/or electrochemical graining process which is optionally followed by anodic oxidation. Further treatment of the aforesaid support material, for example, with polyvinyl phosphonic acid, alkali metal silicate, phosphate, hexafluorozirconate, chromate, borate, polyacrylamide and cellulose derivatives thereof may be desired.

The recording of offset printing matrials obtained from the compositions of the present invention are processed in conventional manner by exposing imagewise and washing out the unexposed layer areas with any of one or more several suitable developers.

As in conventional processes, the recording material is exposed under an original negative using light sources for actinic radiation effective to photopolymerize the exposed portion of the coating composition. Examples of preferred light sources include mercury vapor lamps, and other suitable ultraviolet radiation sources.

Exposure times may be less than about one second to in excess of ten minutes depending upon the amount of particular polymerizable materials present, the photosensitive source, for example, the photoinitiator or negative-working polymerization substance employed, the radiation source, the distance of the photopolymerizable composition from the source, and the thickness of the coating to be cured.

Polymerization inhibitors, such as discussed above, prevent premature spontaneous actinic or thermally induced polymerization, but their effects are overcome by the photoinitiator and/or negative-acting photosensitive substance upon effective exposure of the coating to actinic radiation.

Conventional exposure indicators may also be present in the photopolymerizable coating compositions and are well known and include various dyes and pH indicators.

Development in accordance with the present invention is preferably carried out with aqueous solutions. The developers optionally can contain additives that contribute to the desired accelerated development operation. Particularly suitable additives for this purpose include surfactants and organic solvents and combinations thereof. A preferred development solution for use in accordance with the present coating composition is Western Blue Subtractive Developer, manufactured by Western Lithotech.

Development can be performed in a conventional manner, for example, by dipping, spraying, flowing, brushing or wiping over with a pad.

The photopolymerizable coating compositions of the invention as applied to non-exposed substrates generally range in thickness from about 0.5 to about 50 microns and preferably from about 1 to about 20 microns. The actual thickness will of course depend upon the particular embodiment desired.

A particularly preferred embodiment of the present invention comprises a photopolymerizable coating composition for use with a substrate suitable for use in offset printing, and wherein the composition comprises a diazonium salt condensation product of a condensible aromatic diazonium salt with an aldehyde, preferably the condensation product of 3-methoxy paradiazo diphenylamine with formaldehyde, and further comprising a dye and the grafted cellulose ester polymer of the present invention. In such embodiment, the ratio of the diazonium salt to the grafted cellulose ester polymer can range from about 1:10 to about 10:1 percent by weight and is preferably about 1:3 percent by weight. The dye can be present in an amount from about 0.25 to about 2 weight percent, and the solvent system employed in preparing the composition of this embodiment preferably comprises ethanol, water and PM acetate.

In another preferred embodiment of the present invention, a photopolymerizable coating composition is provided for use with a substrate for offset printing which is preferably an anodized, aluminum substrate and which may be silicated. The coating composition in this embodiment comprises one or more polymerizable monomers or oligomers, a dye or pigment, one or more photoinitiators, one or more stabilizers, and the grafted cellulose ester polymer. A preferred polymerizable monomer for use in this embodiment is trimethylol propane triacrylate, in an amount from about 5 to about 30 weight percent; a preferred dye is Neopen Blue 808, in an amount from about 0.1 to about 6 weight percent; preferred photoinitiators include Irgacure 907 and isopropyl thioxanthone (ITX) in amounts from about 0.5 to about 15 and about 0.2 to about 4 weight percent, respectively; a preferred stabilizer is hydroquinone in an amount from about 0.001 to about 0.1 weight percent; and the grafted cellulose ester polymer is preferably present in an amount of from about 70 to about 95 weight percent.

It is further preferred in the aforesaid embodiment that the coating composition is first applied to the substrate as a single layer base coating. A top coat comprising a binder which is preferably substantially impermeable to oxygen, for example, polyvinyl alcohol, such as described in U.S. Pat. No. 3,458,311 is then appied over the base layer. In embodiments of the present invention, it is preferred that such top coatings are readily soluble in the developer solutions useful in this invention.

In still another particularly preferred embodiment of the present invention there is provided a photopolymerizable coating composition for use in an offset printing plate, wherein the composition comprises the grafted cellulose ester polymer, one or more photoinitiators, one or more diazonium compounds, optionally one or more multifunctional monomers or oligomers and a dye or pigment. In this embodiment, a preferred polymerizible monomer is trimethylol propane triacrylate in an amount up to about 30 weight percent; solvent soluble diazo compounds are preferred in amounts ranging from about 1 to about 90 weight percent; preferred photoinitiators include Irgacure 907 and ITX, in amounts ranging from about 0.5 to about 15 and about 0.2 to about 4 weight percent, respectively; a preferred dye is Victoria Blue in an amount from about 0.5 to about 6 weight percent; and the grafted cellulose ester polymer is preferably present in an amount ranging from about 10 to about 99 weight percent.

In the examples which follow, the invention, preferred embodiments thereof and possible applications are illustrated in detail. It is to be understood, however, that these examples are for illustrative purposes only and are not intended to limit the scope of the specification or claims or the spirit thereof in any way.

EXAMPLE 1

A base coat solution was prepared by mixing the following components until totally dissolved:
  12.4 g Grafted cellulose ester polymer (25% solid in propyl acetate), code name 11996, Eastman Kodak Chemical Co.
  38.6 g Propylene glycol monomethyl ether
  1.86 g Trimethylol propane triacrylate (TMPTA)
  0.078 g Neopen Blue 808
  0.011 g Wetting agent FC-431 (available from 3M)
  0.0021 g Hydroquinone
  0.24 g Irgacure 907
  0.06 g Isopropyl thioxanthone (ITX)

The resulting solution was then coated with a #10 wire-wound rod onto a grained, anodized and silicated aluminum plate substrate and dried. The dry coating weight was about 192 mg/ft$^2$.

A top coat solution was prepared by dissolving the following components in solution:
  10.00 g Airvol 107, a hydrolyzed polyvinyl alcohol manufactured by Air products and Chemicals, Inc.
  90.00 g Water
  0.05 g Proxcel CRL, a preservative made by ICI America
  0.07 g Wetting agent Silwet L-77 available from Union Carbide.

The top coat solution was applied onto the base coat using a #10 wire-wound rod and dried. The dry coating weight was 81 mg/ft$^2$.

The resulting plate was then exposed for 60 units with an Olite Exposure Unit model AL15, manufactured by Olec Corp. The plate was then developed by using a plate processor Lithoplater 38D with a Western Blue subtractive developer, both manufactured by Western Lithotech. The processed plate showed 6 solid steps with a total of 7 steps. The image was very hydrophobic and ink receptive. Abrasion resistance was excellent.

Samples of exposed and processed plates such as above-described were next immersed in the following press chemicals to test their durability to typical chemicals found on a printing press:

1. Rycoline alkaline fountain solution, concentrate 5-103.
2. Rycoline neutral fountain solution, concentrate 5-125.
3. Rycoline Recon plate cleaners and scratch remover.
4. Rycoline blanket and roller wash Y-120.

After 19 hours of immersion, #2 and #4 did not have any effect on the plate; #1 dulled the aluminum substrate but did not affect the photopolymer images and #3 dissolved the aluminum substrate while leaving the image unaffected. The results indicate that the cured compositions of this invention are highly resistant to press chemicals.

EXAMPLE 2

The formulation and procedure of Example 1 was repeated except that TMPTA was replaced by Ebecryl 220, a hexafunctional, aromatic, urethane-containing acrylate oligomer, manufactured by Radcure Specialties, Inc.

After processing, the plate yielded a solid step of 5 and total steps of 6. The processed plate also exhibited excellent ink receptive and abrasion resistant images.

EXAMPLE 3

The formulation and procedure of Example 1 was repeated except that TMPTA was replaced by a 1:1 by weight mixture of TMPTA and Ebecryl 220. Similar results as in Example 2 were obtained.

EXAMPLE 4

The formulation of Example 1 was repeated except that the concentration of Irgacure 907 and ITX were increased to 1.60 g and 0.40 g, respectively. No top coat was applied over the base coat.

After exposure and processing as in Example 1, the developed plate showed a solid step of 4 and a total step of 5. The image was highly suitable for use as lithographic printing plate.

EXAMPLE 5

A suitable substrate was prepared by using a sheet of lithographic grade aluminum (such as Alcoa 3003 or 1100 alloy) and pretreating it with the standard graining, anodizing, and silicating techniques that are well known in the art. This substrate was then coated with the following solution compositions using Black Brothers roll coaters.

| Component | % by weight |
|---|---|
| Ethyl alcohol 190 | 45.0 |
| Propylene glycol mono-methyl ether | 41.5 |
| Solvent soluble diazo | 1.0 |
| Kodak PM 11996 resin solution | 12.0 |
| Victoria blue dye | 0.5 |

The coating was applied in two passes with sufficient drying after each pass. The coat weight of the dried coating was 50±5 mg./ft².

A sample of a plate as described above was then placed in a vacuum printing frame and exposed for a standard amount of time (e.g. 40 units on a Theimer Mountakap, type 5500, Model #3630.) The resulting sample was then processed through a Western 38D brush processor using Western Blue subtractive developer. The resulting plate demonstrated good speed (a solid step 7 on a Stouffer 21 step sensitivity scale), good contrast and excellent image integrity with regard to abrasion and chemical resistance.

Abrasion resistance was measured on a Gardner abrader, 50 cycles (10 strokes) using a weighted 3M Scotch-Brite TM pad soaked with alkaline fountain solution. After testing, the image was found to be still intact with very little, if any, damage to the substate beneath it.

Chemical resistance was measured in two ways: (1) By weight loss of image upon development, and (2) By studying the attack on the image by the standard types of press chemicals.

The image weight loss was determined by blanket exposing a one (1) square foot piece to the normal amount of exposure then weighing the piece prior to and after development. In this example, the image loss was found to be less than 2%.

The chemical attack on the image was performed by applying press chemicals in their concentrated form to the image then using a cotton pad rubbing hard across the image and the background of the plate for a total of 10 seconds. The chemicals tested were produced by Rycoline Products, Inc., and are as follows:

1. A neutral fountain solution referred to as Seven 5-125 which has a pH of 7.0 and contains the solvent Dipropylene glycol Methyl Ether.
2. An alkaline fountain solution referred to as Alkaline Fountain Solution which has a pH of 11 and contains the solvent dipropylene glycol methyl ether.
3. Blanket and Roller wash which contains a mixture of aliphatic and aromatic solvents.
4. Re-Con Plate Cleaner which has a pH of 13 and contains the solvent ethylene glycol n-butyl ether.

The results of this test showed no loss of image density, no pick up of coating on the pad and no sign of contamination to the background of the plate.

A plate that was prepared and processed such as described in this example has exhibited excellent ink pick-up by the imaged areas and runs clean in the non-imaged area when mounted on press producing in excess of 100,000 images with excellent reproduction quality.

EXAMPLE 6

The substrate from Example 5 was prepared and coated in the same manner with the following solution composition:

| Component | % by weight |
|---|---|
| Ethyl alcohol 190 | 45.00 |
| Propylene glycol mono-methyl ether | 40.15 |
| Solvent soluble diazo | 1.00 |
| Kodak PM11996 resin solution | 12.00 |
| Trimethylol propane trimetharylate | 1.00 |
| Irgacure 907 | .30 |
| Quanticure ITX | .05 |
| Victoria blue dye | .50 |

The resulting plate from this coating demonstrates properties identical to those of the plate of Example 5.

What is claimed is:

1. A photopolymerizable coating composition comprising
   (a) a diazonium salt condensation product of a condensible aromatic diazonium compound with an aldehyde;
   (b) an ethylenically unsaturated, urethane-containing, self-crosslinkable cellulose ester polymer of the formula

wherein
R¹ is a (meth)acrylate moiety of the formula

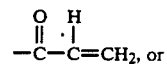

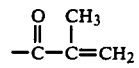

R² is a α-methylstyrene moiety of the formula

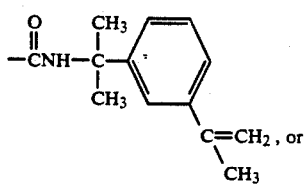

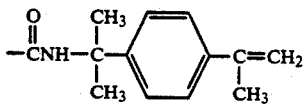

$R^3$ is independently H,

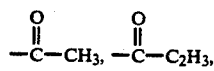

or 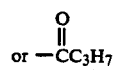

x is 0.1 to 2.5
y is 0.1 to 2.0
z is 0.1 to 2.0 and
n is 30–250, provided that (x+y+z) is in the range of 0.3 to 3.0 and
(c) a dye.

2. The photopolymerizable coating composition of claim 1 wherein the diazonium salt is obtained from condensation of 3-methoxy paradiazo diphenylamine with formaldehyde and wherein the ratio of the diazonium salt to the grafted cellulose ester polymer is from about 1:10 to about 10:1 weight percent.

3. The photopolymerizable coating composition of claim 2, wherein the ratio of the diazonium salt to cellulose polymer is about 1:3 weight percent.

4. A printing plate comprising a lithographic substrate coated with the photopolymerizable composition of claim 1.

5. The printing plate of claim 4 wherein the substrate comprises a grained and anodized aluminum substrate.

6. The printing plate of claim 4, wherein the substrate comprises a grained and anodized silicated aluminum substrate.

7. The printing plate of claim 4 further comprising an organic polymer layer which is substantially impermeable to oxygen and is soluble in aqueous developers, and which is coated over the photopolymerizable coating composition.

8. A printing plate comprising a lithographic substrate coated with a photopolymerizable coating composition comprising
(a) one or more ethylenically unsaturated acrylic polymerizable monomers or oligomers;
(b) a dye or pigment;
(c) a photoinitiator;
(d) a stabilizer; and
(e) an ethylenically unsaturated urethane-containing, self-crosslinkable grafted cellulose ester polymer of the formula:

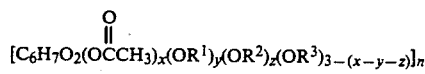

wherein $R^1$ is a (meth)acrylate moiety of the formula

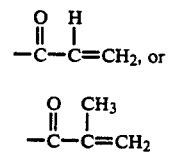

$R^2$ is a α-methylstyrene moiety of the formula

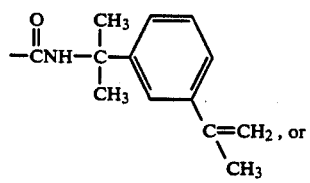

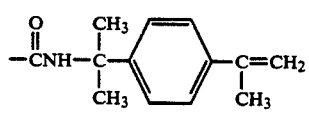

$R^3$ is independently H,

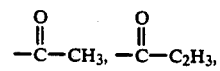

or 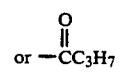

x is 0.1 to 2.5
y is 0.1 to 2.0
z is 0.1 to 2.0 and
n is 30–250, provided that (x+y+z) is in the range of 0.3 to 3.0.

9. The printing plate of claim 8 wherein the ethylenically unsaturated polymerizable monomer or oligomer of the photopolymerizable coating composition is a multifunctional acrylate compound and is present in an amount from about 5 to about 30 weight percent; the photoinitiator is selected from the group consisting of 2-methyl-1-[4(methylthio)phenyl)-2-morpholinopropanone-1 and isopropyl thioxanthone and is present in an amount from about 0.5 to about 15 weight percent and from about 0.2 to about 4 weight percent, respectively; the stabilizer is hydroquinone and is present in an amount ranging from about 0.001 to about 0.1 weight percent; the dye or pigment is selected from the group consisting of solvent dyes or cationic dyes and is present in an amount from about 0.5 to about 6 weight percent; and the grafted cellulose ester polymer is present in an amount from 70 to about 95 weight percent.

10. The printing plate of claim 8, wherein the substrate comprises a grained and anodized aluminum substrate.

11. The printing plate of claim 8 wherein the substrate comprises a grained and anodized silicated aluminum substrate.

12. The printing plate of claim 8 further comprising an organic polymer layer which is substantially impermeable to oxygen and is soluble in aqueous developers, and which is coated over the photopolymerizable coating composition.

13. A printing plate comprising a lithographic substrate coated with a photopolymerizable coating composition comprising
(a) one or more ethylenically unsaturated polymerizable monomers or oligomers;
(b) a dye or pigment;
(c) a photoinitiator;
(d) a diazonium salt; and
(e) an ethylenically unsaturated, urethane-containing self-crosslinkable grafted cellulose ester polymer of the formula

wherein
$R^1$ is a (meth)acrylate moiety of the formula

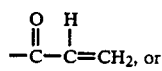

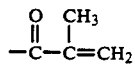

$R^2$ is a α-methylstyrene moiety of the formula

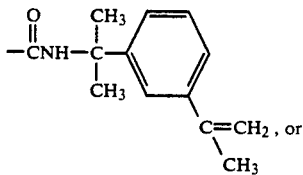

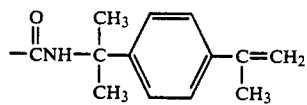

$R^3$ is independently H,

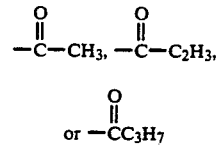

x is 0.1 to 2.5
y is 0.1 to 2.0
z is 0.1 to 2.0 and
n is 30–250, provided that (x+y+z) is in the range of 0.3 to 3.0.

14. The printing plate of claim 13 wherein the ethylenically unsaturated polymerizable monomers or oligomers of the photopolymerizable coating composition are multifunctional acrylates and present in an amount up to about 30 weight percent; the photoinitiator is selected from the group consisting of 2-methyl-1-[4-(methylthio)phenyl]-2-morpholinopropanone-1 and isopropyl thioxanthone and is present in an amount from about 0.5 to about 15 weight percent and from about 0.2 to about 4 weight percent, respectively; the diazonium salt is solvent soluble diazo and is present in an amount from about 1 to about 90 weight percent; and the grafted cellulose ester polymer is present in an amount from about 10 to about 99 weight percent.

15. A printing plate of claim 13, wherein the substrate comprises a grained, anodized aluminum substrate.

16. The printing plate of claim 15 further comprising an organic polymer layer which is substantially impermeable to oxygen and is soluble in aqueous developers, and which is coated over the photopolymerizable coating composition.

17. The printing plate of claim 13 wherein the substrate comprises a grained, anodized silicated aluminum substrate.

18. The printing plate of claim 13 further comprising an organic polymer layer which is substantially impermeable to oxygen and is soluble in aqueous developers, and which is coated over the photopolymerizable coating composition.

* * * * *

UNITED STATES PATENT AND TRADEMARK OFFICE
CERTIFICATE OF CORRECTION

PATENT NO. :   5,254,429
DATED      :   October 19, 1993
INVENTOR(S):   Gracia et al.

It is certified that error appears in the above-indentified patent and that said Letters Patent is hereby corrected as shown below:

Col. 7, line 22     "prematurely. Such" (period left out)

Col. 7, line 48     "butanone. If" (period left out)

Col. 11, line 56    "substate" should read "substrate"

Col. 16, line 38    change "claim 13" to --claim 15--.

Signed and Sealed this

Fourth Day of October, 1994

Attest:

BRUCE LEHMAN

Attesting Officer    Commissioner of Patents and Trademarks